(12) United States Patent
Kim

(10) Patent No.: US 6,337,891 B1
(45) Date of Patent: Jan. 8, 2002

(54) CLOCK SYNCHRONIZATION METHOD

(75) Inventor: Joo Yong Kim, Incheon (KR)

(73) Assignee: Mercury Corporation, Incheon (KR)

( * ) Notice: Subject to any disclaimer, the term of this patent is extended or adjusted under 35 U.S.C. 154(b) by 0 days.

(21) Appl. No.: 09/216,838

(22) Filed: Dec. 21, 1998

(30) Foreign Application Priority Data

Dec. 23, 1997 (KR) ............................................. 97-72432

(51) Int. Cl.⁷ ............................. H03D 3/24; H03L 7/00; H03L 7/06
(52) U.S. Cl. ..................... 375/376; 375/371; 327/141; 327/156
(58) Field of Search ................................ 375/354, 371, 375/373, 376; 327/141, 147, 155, 156, 162, 163; 331/1 A, 1 R, 18, 17, 25; 455/260; 713/400, 500, 502, 503

(56) References Cited

U.S. PATENT DOCUMENTS

| | | | |
|---|---|---|---|
| 4,498,059 A | * 2/1985 | Edwards et al. | ............ 331/1 A |
| 5,373,255 A | * 12/1994 | Bray et al. | .................. 331/1 A |
| 6,154,511 A | * 11/2000 | Nakamura et al. | .......... 375/376 |
| 6,188,739 B1 | * 2/2001 | Everitt et al. | ................ 375/376 |

* cited by examiner

*Primary Examiner*—Betsy L. Deppe
(74) *Attorney, Agent, or Firm*—Bacon & Thomas, PLLC

(57) ABSTRACT

A clock synchronization method, for use in generating a system clock of a predetermined frequency with reference to a reference clock, receives the reference clock, the system clock and a divided clock having a same frequency as that of the reference clock, wherein the divided clock is obtained by dividing the system clock by a predetermined integer. Phase deviations between the reference clock and the divided clock are obtained, wherein a phase deviation is the number of periods of the system clock in a section between a rising edge of the reference clock and a nearest rising edge of the divided clock. Consecutive phase deviations are averaged to thereby generate an average phase deviation of a 3rd order, wherein the number of averaged consecutive phase deviations varies according to phase jitter characteristics of the reference clock. And, the frequency of the system clock is controlled based on the average phase deviation of the 3rd order.

6 Claims, 5 Drawing Sheets

CLOCK SYNCHRONIZATION METHOD

FIELD OF THE INVENTION

The present invention relates to a clock synchronization method by using a digital processing phase locked loop(DP-PLL); and, more particularly, to a clock synchronization method capable of attenuating jitter included in a reference clock.

DESCRIPTION OF THE PRIOR ART

Phase Locked Loops(PLL's) are found in a myriad of electronic applications, such as communication receivers and clock synchronization circuits in computer systems, for providing a reference clock with a known phase for clocking incoming and outgoing data. A conventional charge pump PLL comprises a phase detector for monitoring the phase difference between an input clock signal and an output signal from a voltage controlled crystal oscillator (VCXO) and generating an up control signal and a down control signal for a charge pump circuit which charges and discharges a loop filter at the input of the VCXO. The up and down control signals increase and decrease the VCXO output frequency, respectively, to maintain a predetermined phase relationship between signals applied to the phase detector, as is well known.

A common problem with conventional PLL's is the occurrence of a phase jitter at the output of the VCXO. When the phase difference between the output signal of the VCXO and the input clock signal becomes less than the resolution of the PLL, the phase detector continuously corrects the VCXO for the perceived phase error. Thus, the output signal from the VCXO jumps back and forth between a phase lead and a phase lag with respect to the input clock signal. Such a phase jitter reduces the effective bandwidth of the PLL since the output edge location of the output signal from the VCXO continuously changes. Therefore, the phase of the output signal of the VCXO is accurate only within the jitter window.

A PLL circuit is disclosed in U.S. Pat. No. 5,126,693 issued to William et al. in order to overcome this problem. The William et al. is directed to a phase locked loop reducing output phase jitter by averaging an input clock signal and a delayed input clock signal. A control signal selects one of the input clock signal and the delayed input clock signal for providing a reference clock signal for the phase locked loop. The output oscillator signal of the PLL is divided by a predetermined integer value for providing the control signal to select either one of the input clock signal and the delayed input clock signal. The PLL establishes a phase lock to the input clock signal during a first state of the control signal and then establishes a phase lock to the delayed input clock signal during a second state of the control signal such that the average value of the output signal of the PLL is substantially constant.

Although the PLL devised by William et al. generates a substantially constant output by selectively applying an input clock signal or a delayed input clock signal as a reference signal, it is still required to develop a more efficient algorithm to cope with the problem resulting from the phase jitter.

SUMMARY OF THE INVENTION

It is, therefore, a primary object of the invention to provide a clock synchronization method capable of attenuating jitter included in a reference clock.

In accordance with one aspect of the present invention, there is provided a clock synchronization method for generating a system clock of a predetermined frequency with reference to a reference clock, comprising the steps of: (a) receiving the reference clock, the system clock and a divided clock having a same frequency as that of the reference clock, wherein the divided clock is obtained by dividing the system clock by a predetermined integer; (b) obtaining phase deviations between the reference clock and the divided clock, a phase deviation being the number of periods of the system clock in a section between a rising edge of the reference clock and a nearest rising edge of the divided clock; (c) averaging consecutive phase deviations to thereby generate an average phase deviation of a 3rd order, wherein the number of averaged consecutive phase deviations varies with the phase jitter characteristics of the reference clock; and (d) controlling the frequency of the system clock based on the average phase deviation of the 3rd order.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
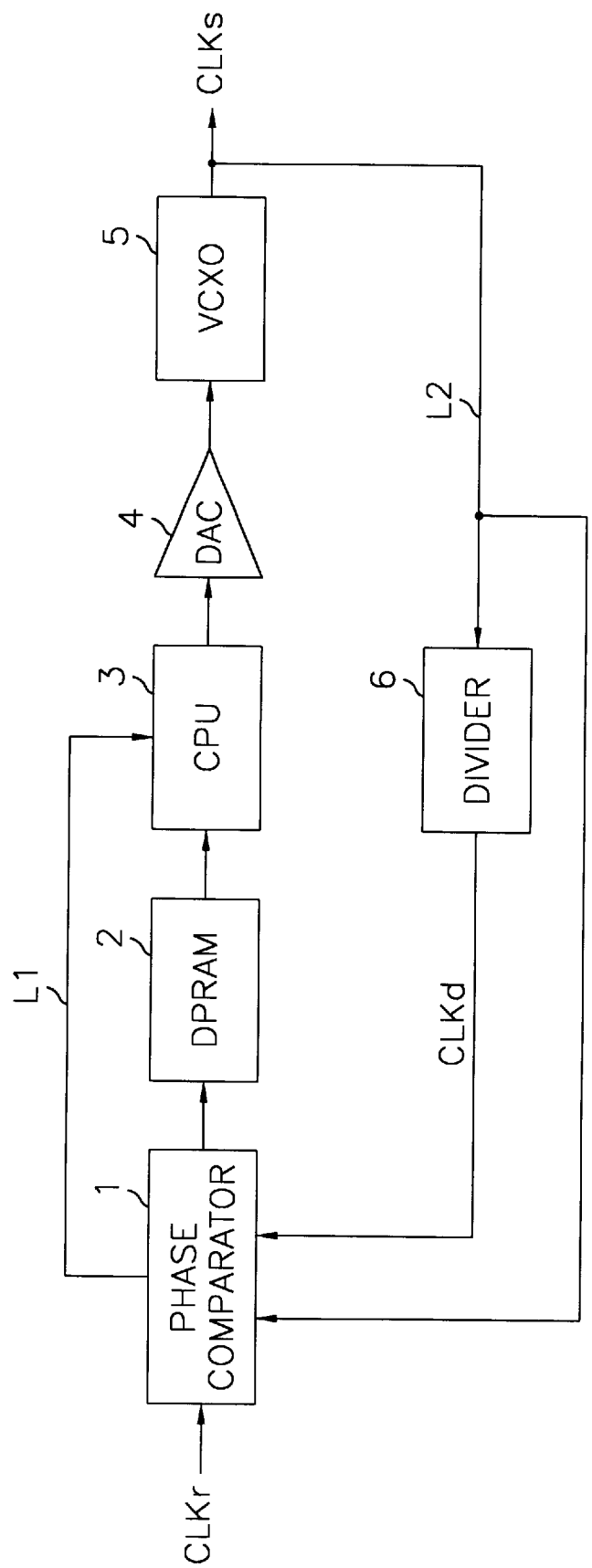
FIG. 1 represents a block diagram of a DP-PLL circuit in accordance with the present invention.

Referring to FIG. 1, there is provided a block diagram of a DP-PLL(digital processing-phase locked loop) circuit in accordance with a preferred embodiment of the present invention, wherein the circuit comprises a phase comparator 1, a digital processing random access memory(DPRAM) 2, a central processing unit (CPU) 3, a digital-to-analog converter (DAC) 4, a voltage controlled crystal oscillator (VCXO) 5 and a divider 6.

The phase comparator 1 receives a reference clock signal CLKr, a system clock signal CLKs and a divided clock signal CLKd, wherein the CLKr is of, e.g., 4 KHz; the CLKs is of, e.g., 32.768 Mhz, and obtained as an output of the voltage controlled crystal oscillator 5; and the CLKd is of the same frequency as that of the CLKr, i.e., 4 KHz, and obtained by dividing the CLKs by an integer, e.g., 8192.

Figures 2A, 2B, 2C:
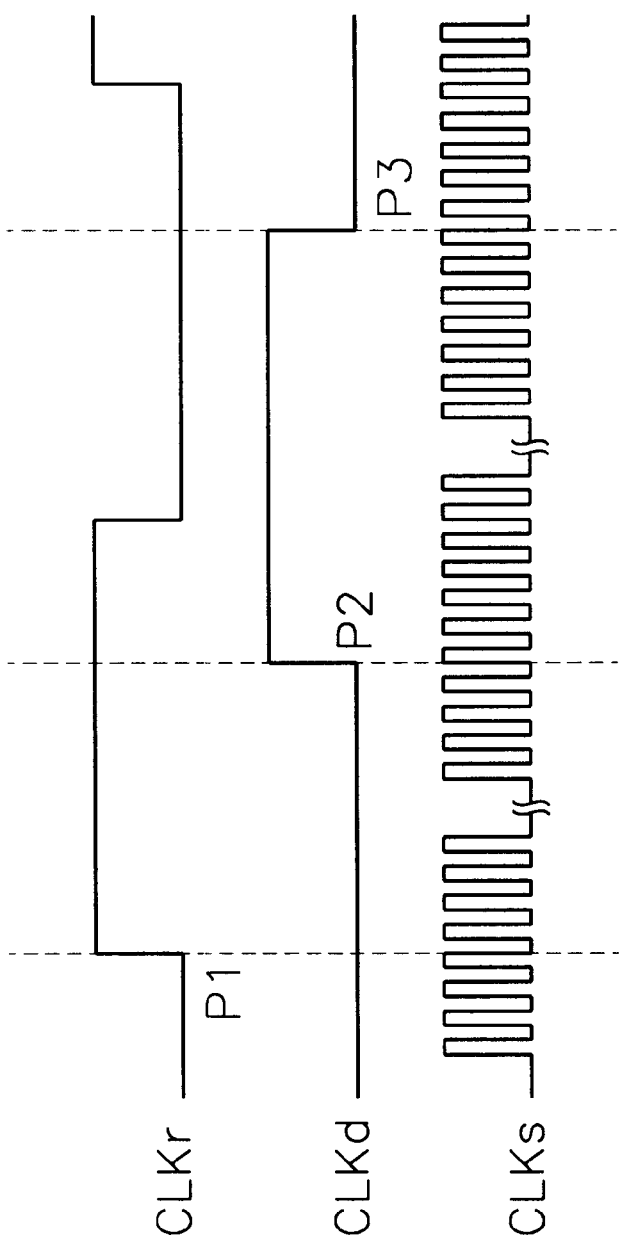
FIGS. 2A to 2C provide timing charts of a reference clock, a divided clock and a system clock, respectively.

The phase comparator 1 compares the CLKr, CLKd and CLKs with each other, to determine a phase deviation, as is shown in FIGS. 2A to 2C. The phase deviation is determined by counting the number of CLKs in a section between a rising edge P1 of the CLKr and a rising edge P2 of the CLKd and then, stored at the DPRAM 2. When phase deviations corresponding to a predetermined number of, e.g., 512, periods of CLKr is determined, the phase comparator 1 provides an interrupt signal to the CPU 3 via a line L1.

In response to the interrupt signal from the phase comparator 1, the CPU 3 sequentially extracts the 512 number of phase deviations stored at the DPRAM 2 and compares two consecutively read phase deviations with each other, the one read earlier as a previous phase deviation and the one read later as a current phase deviation. If the difference between the previous phase deviation and the current phase deviation is smaller than a predetermined threshold k, k being a positive integer, the CPU 3 accumulates the current phase deviation; and if otherwise, the CPU 3 considers that a momentary phase jitter is inputted and does not accumulate the current phase deviation. Then, the CPU 3 divides the accumulated value by the number of accumulated phase deviations to generate an average phase deviation of a 1st order.

The procedure for obtaining the average phase deviation of the 1st order is illustrated with reference to FIG. 3. At step S1, the CPU 3 checks if the interrupt signal is applied from the phase comparator 1. If the checked result is negative, the checking procedure will be continued at step S1; and if otherwise, the procedure goes to step S2. At step S2, SUM1 and I are initialized with 0 and i is initialized with 1, wherein SUM1 denotes a currently accumulated value of the phase deviations; I, the number of the accumulated phase deviations; and i, the index of the phase deviations stored at the DPRAM 2.

At step S3, i is compared with L, L being the predetermined number, e.g., 512. In other words, it is checked whether or not all the predetermined number of the phase deviations are processed. If i is greater than L, the procedure goes to step S5, wherein the average phase deviation of the 1st order AVG1 is determined by dividing SUM1 by I; and if otherwise, the procedure goes to step S4, wherein an ith phase deviation DATA(i) is extracted from the DPRAM 2 and read by the CPU 3.

Then, at step S6, DATA(i) is compared with DATA(i−1), wherein DATA(i−1) is an (i−1)st phase deviation and DATA (O) is set to be equal to DATA(1). If the difference between DATA(i) and DATA(i−1) is smaller than the predetermined threshold k, the procedure goes to step S7, wherein I is increased by 1 and DATA(i) is added to SUM1 to update the SUM1; and if otherwise, the procedure goes directly to step S8 by skipping step S7, wherein i is increased by 1 and the procedure goes back to step S3.

Figure 3:
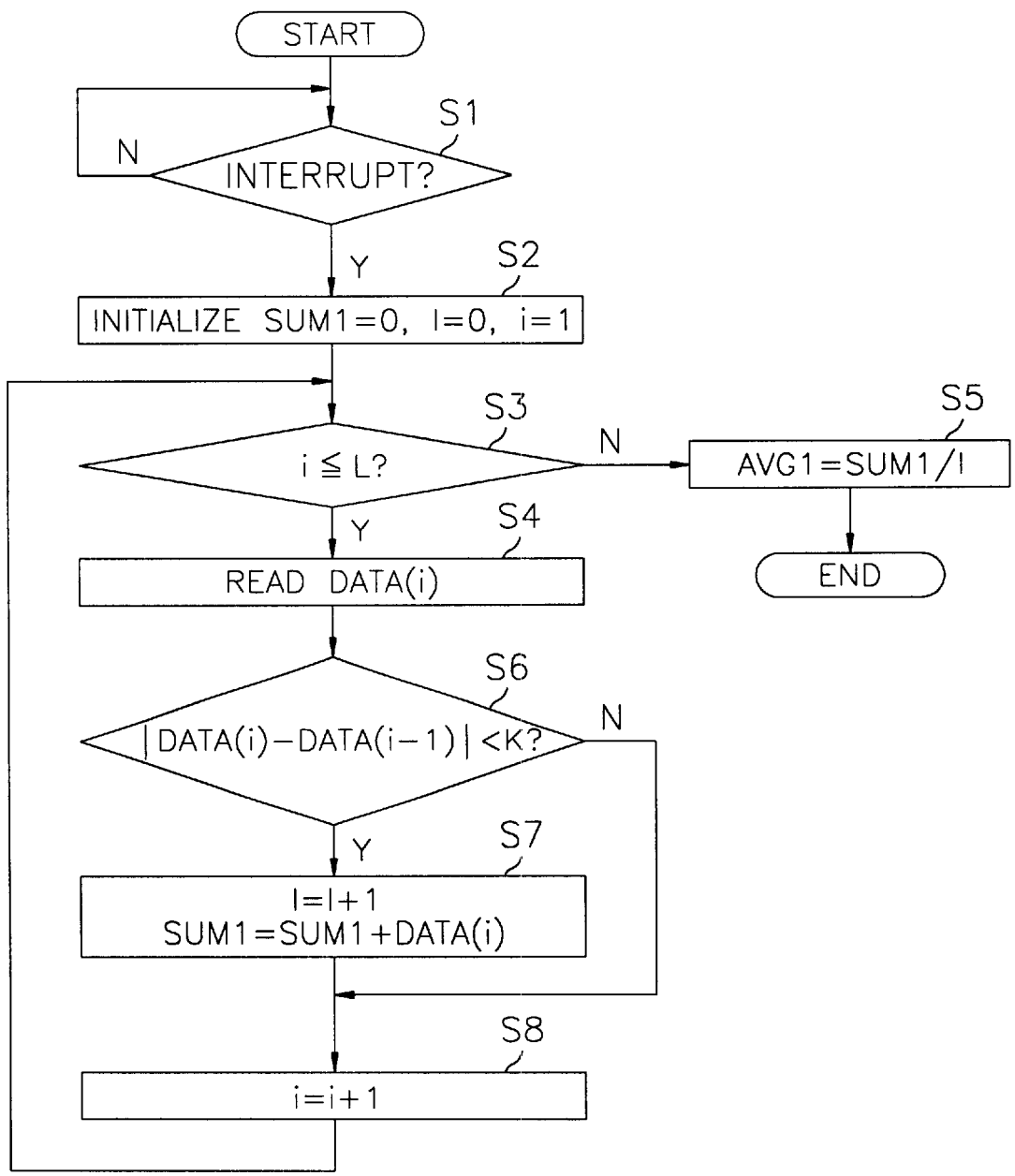
FIG. 3 shows a flow chart for obtaining an average phase deviation of a 1st order.

Thereafter, the CPU 3 averages 8 consecutive average phase deviations of the 1st order calculated by the procedure shown in FIG. 3 to generate an average phase deviation of a 2nd order and compares 3 consecutive average phase deviations of the 2nd order with each other. If the 3 consecutive average phase deviations of the 2nd order gradually increase or decrease, the CPU 3 considers that there occurs no phase jitter and averages a first preset number of, e.g., 8, consecutive average phase deviations of the 2nd order to generate an average phase deviation of a 3rd order; and if otherwise, the CPU 3 considers that there occurs phase jitter and averages a second preset number of, e.g., 16, consecutive average phase deviations of the 2nd order to generate an average phase deviation of the 3rd order.

Figure 4A:
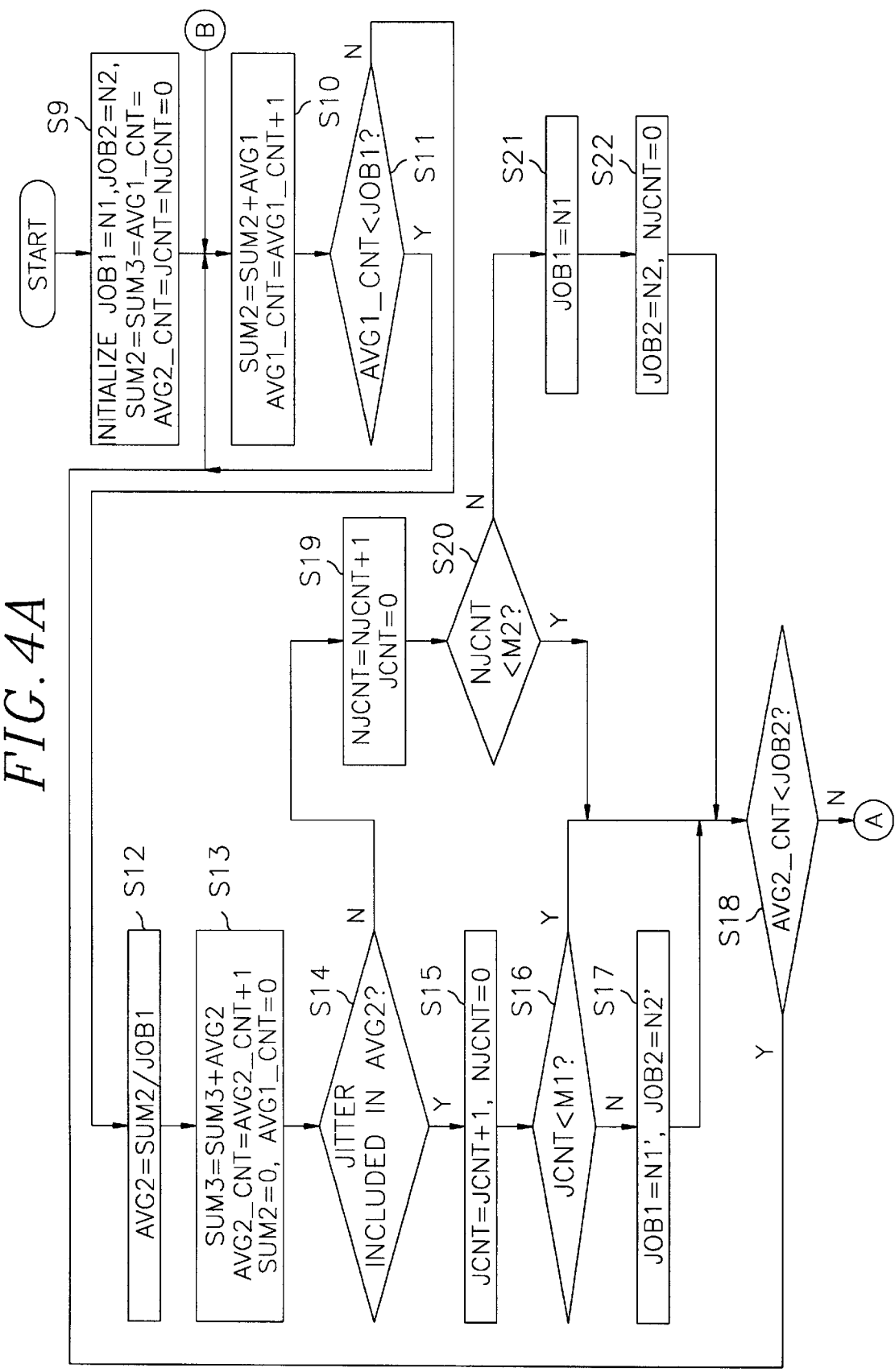
FIGS. 4A and 4B present a flow chart for determining a digital to analog converter word.
Figure 4B:
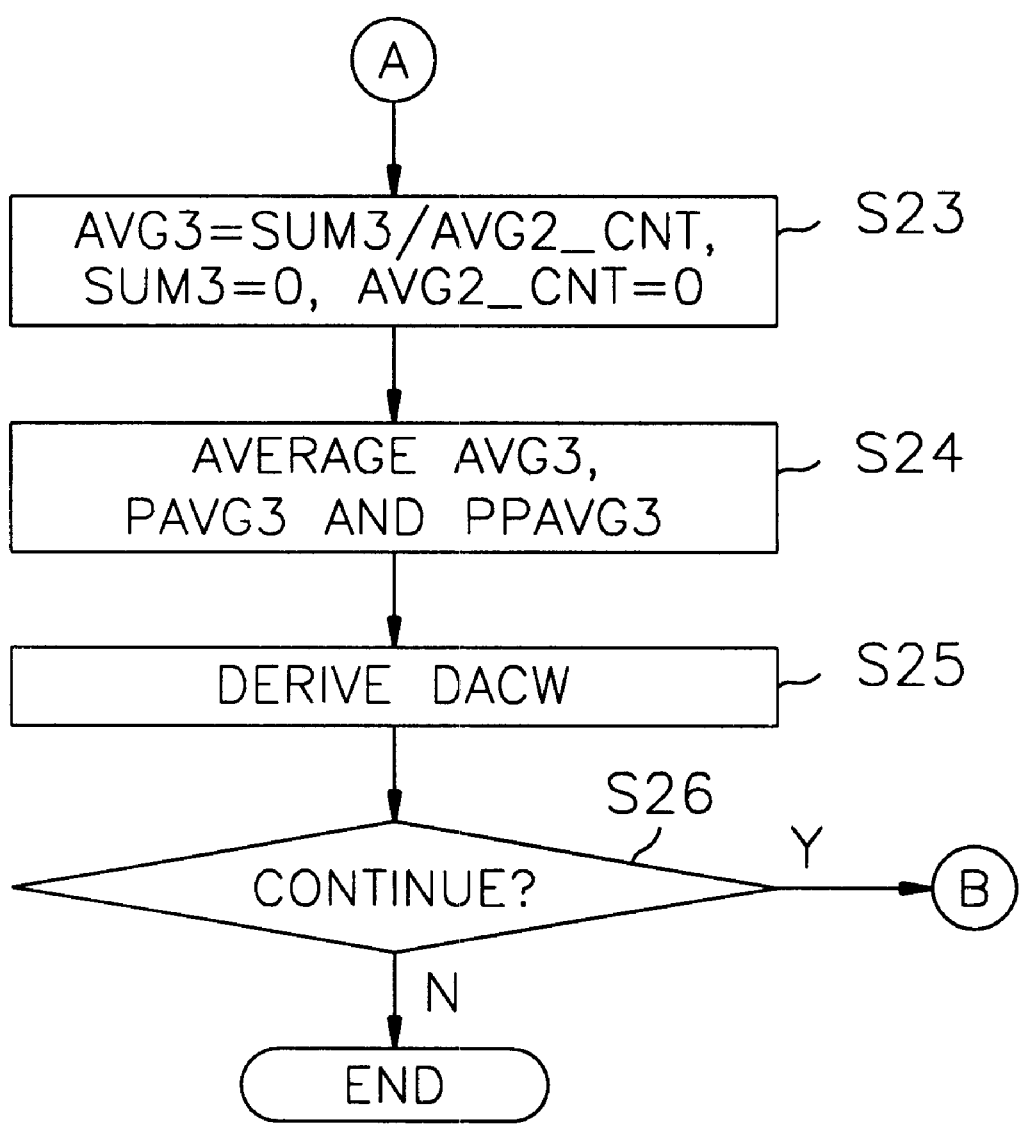

Based on the generated average phase deviation of the 3rd order, the CPU derives a digital-to-analog converter word (DACW) and provides same to the DAC 4. The detailed procedure for determining the control signal is described with reference to FIGS. 4A to 4B.

At step S9, JOB1 is initialized with N1, N1 being a predetermined positive integer; JOB2, with N2, N2 being a predetermined positive integer; and SUM2, SUM3, AVG1_CNT, AVG2_CNT, JCNT and NJCNT, with 0, wherein JOB1 denotes the number of the average phase deviations of the 1st order which are used in determining the average phase deviation of the 2nd order; JOB2, the number of the average phase deviations of the 2nd order which are used in determining the average phase deviation of the 3rd order; SUM2, a currently accumulated value of the average phase deviations of the 1st order; SUM3, a currently accumulated value of the average phase deviations of the 2nd order; AVG1_CNT, the number of accumulated phase deviations of the 1st order; AVG2_CNT, the number of accumulated phase deviations of the 2nd order; JCNT, the number of times when the phase jitter has occurred according to the CPU 3; and NJCNT, the number of times when no phase jitter has occurred according to the CPU 3.

Then, at step S10, AVG1 is added to SUM2 to update SUM2 and AVG1_CNT is increased by 1. At step S11, AVG1_CNT is compared with JOB1, that is, it is examined whether the preset number of the average phase deviations of the 1st order are accumulated or not. If AVG1_CNT is smaller than JOB1, the procedure returns to step S10; and if otherwise, the procedure goes to step S12, wherein AVG2 is determined by dividing SUM2 by JOB1.

At step S13, AVG2 determined at step S12 is added to SUM3 to update SUM3; AVG2_CNT is increased by 1; and SUM2 and AVG1_CNT is reset to 0. At step S14, it is checked if the phase jitter is included in AVG2, by comparing 3 consecutive AVG2's. If the 3 consecutive AVG2's do not gradually increase or decrease, the CPU 3 decides that there has occurred a phase jitter and the procedure goes to step S15, wherein JCNT is increased by 1 and NJCNT is reset to 0; and if otherwise, the CPU 3 considers that there has occurred no phase jitter and the procedure goes to step S19, wherein NJCNT is increased by 1 and JCNT is reset to 0.

At step S16, JCNT is compared with M1, M1 being a predetermined positive integer. If JCNT is smaller than M1, the procedure goes directly to step S18 by skipping step S17; and if otherwise, the procedure goes to step S17, wherein the value of JOB1 is set to N1', N1' being a predetermined positive integer and the value of JOB2 is set to N2' before proceeding to step S18, N2' being a predetermined positive integer.

At step S18, AVG2_CNT is compared with JOB2, wherein JOB2 is equal to N2' if there has occurred M1 or more number of phase jitters and JOB2 is equal to N2 if otherwise. If AVG2_CNT is smaller than JOB2, the procedure returns to step S10; and if otherwise, the procedure goes to step S23.

Meanwhile, at step S20 after step S19, NJCNT is compared with M2, M2 being a predetermined positive integer. If NJCNT is smaller than M2, the procedure goes to step S18; and if otherwise, the procedure goes to step S21, wherein the value of JOB1 is set to N1. At step S22, the value of JOB2 is set to N2 and NJCNT is reset to 0 before proceeding to step S18.

At step S23, AVG3 is obtained by dividing SUM3 by AVG_CNT, and then, SUM3 and AVG2_CNT is reset to 0. At step S24, 3 consecutive average phase deviations of the 3rd order, i.e., AVG3 which is currently obtained, PAVG3 which was obtained just before AVG3 and PPAVG3 which was obtained just before PAVG3, are averaged. The DACW is derived, at step S25, based on the averaged value of the step S24 and it is checked whether the procedure continues or not, at step S26. If the checked result is affirmative, the procedure goes back to step S10; and if otherwise, the procedure ends.

The DAC 4 is provided with the DACW from the CPU 3 and converts the DACW into a control signal. In response to the control signal from the DAC 4, the VCXO 5 increases or decreases the frequency of the output clock signal CLKs and provides the CLKs to the divider 6 and the phase comparator 1 via a line L2. The divider 6 divides the CLKs by the integer, i.e., 8192 to provide CLKd to the phase comparator 1.

In accordance with the present invention, the number of phase deviations, for use in generating the digital-to-analog converter word(DACW), is varied based on the jitter occurrence. By carefully observing the jitter occurrence, the average phase deviation of the 3rd order is flexibly calculated to thereby efficiently control the frequency of the output signal.

While the present invention has been described with respect to certain preferred embodiments only, other modifications and variations may be made without departing from the spirit and scope of the present invention as set forth in the following claims.

What is claimed is:

1. A clock synchronization method for generating a system clock of a predetermined frequency with reference to a reference clock, comprising the steps of:

(a) receiving the reference clock, the system clock and a divided clock having a same frequency as that of the reference clock, wherein the divided clock is obtained by dividing the system clock by a predetermined integer;

(b) obtaining phase deviations between the reference clock and the divided clock, a phase deviation being the number of periods of the system clock in a section between a rising edge of the reference clock and a nearest rising edge of the divided clock;

(c) averaging consecutive phase deviations to thereby generate an average phase deviation of a 3rd order, wherein the number of averaged consecutive phase deviations varies with the phase jitter characteristics of the reference clock; and (d) controlling the frequency of the system clock based on the average phase deviation of the 3rd order.

2. The clock synchronization method of claim 1, wherein the step (c) includes the steps of:

(c1) averaging phase deviations among L number of consecutive phase deviations except for salient phase deviations to generate an average phase deviation of a 1st order, wherein a salient phase deviation is a phase deviation whose difference from a previous phase deviation is greater than or equal to K, K and L being positive integers;

(c2) averaging N1 number of consecutive average phase deviations of the 1st order to generate an average phase deviation of a 2nd order and averaging N2 number of consecutive average phase deviations of the 2nd order to generate the average phase deviation of the 3rd order if the number of times when no phase jitter has occurred is greater than or equal to M; and (c3) averaging N1' number of consecutive average phase deviations of the 1st order to generate the average phase deviation of the 2nd order and averaging N2' number of consecutive average phase deviations of the 2nd order to generate the average phase deviation of the 3rd order if otherwise, wherein N1, N1', N2, N2' and M are positive integers, N1 is smaller than N1' and N2 is smaller than N2'.

3. The clock synchronization method of claim 2, wherein the step (c1) includes the steps of:

(c11) setting i to 1 and SUM1 to 0, wherein i is an index for the phase deviations and SUM1 is a sum of the phase deviations;

(c12) retrieving an ith phase deviation;

(c13) comparing the ith phase deviation with an (i−1)st phase deviation, with 0th phase deviation being set to be equal to a 1st phase deviation;

(c14) increasing i by 1 after adding the ith phase deviation to SUM1 if a difference between the ith phase deviation and the (i−1)st phase deviation is smaller than K; and increasing i by 1 without adding the ith phase deviation to SUM1 if otherwise;

(c15) repeating the steps (c12) to (c14) until i becomes L; and (c16) dividing SUM1 by the number of added phase deviations to generate the average phase deviation of the 1st order.

4. The clock synchronization method of claim 3, wherein the step (c2) includes the steps of:

(c21) averaging N1 number of consecutive average phase deviations of the 1st order generated at the step (c1) to generate an average phase deviation of the 2nd order;

(c22) comparing 3 consecutive average phase deviations of the 2nd order to determine if there occurs the phase jitter; and (c23) counting the number of times when no phase jitter successively occurs.

5. The clock synchronization method of claim 4, wherein the step (c22) determines that there occurs no phase jitter if the 3 consecutive average phase deviations gradually increase or decrease; and determines that there occurs the phase jitter if otherwise.

6. The clock synchronization method of claim 5, wherein the step (c2) further includes the steps of:

(c24) averaging N1 number of next consecutive average phase deviations of the 1st order to generate the average phase deviation of the 2nd order and averaging N2 number of consecutive average phase deviations of the 2nd order to generate the average phase deviation of the 3rd order if the counted number of times when no phase jitter successively occurs is smaller than M2, M2 being a positive integer; and (c25) averaging N1' number of next consecutive average phase deviations of the 1st order to generate the average phase deviation of the 2nd order and averaging N2' number of consecutive average phase deviations of the 2nd order to generate the average phase deviation of the 3rd order if otherwise.

* * * * *